(12) United States Patent
Ku

(10) Patent No.: US 9,448,866 B2
(45) Date of Patent: Sep. 20, 2016

(54) MONITORING DEVICE OF INTEGRATED CIRCUIT

(71) Applicant: SK hynix Inc., Gyeonggi-do (KR)

(72) Inventor: Kie-Bong Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/792,167

(22) Filed: Jul. 6, 2015

(65) Prior Publication Data

US 2015/0310935 A1 Oct. 29, 2015

Related U.S. Application Data

(62) Division of application No. 13/232,241, filed on Sep. 14, 2011, now Pat. No. 9,104,571.

(30) Foreign Application Priority Data

May 2, 2011 (KR) ........................ 10-2011-0041554

(51) Int. Cl.
| | | |
|---|---|---|
| G06F 11/07 | (2006.01) | |
| G11C 29/44 | (2006.01) | |
| G11C 29/04 | (2006.01) | |
| G11C 29/42 | (2006.01) | |
| G11C 29/52 | (2006.01) | |
| G11C 29/38 | (2006.01) | |

(52) U.S. Cl.
CPC ....... *G06F 11/0727* (2013.01); *G06F 11/0772* (2013.01); *G06F 11/0784* (2013.01); *G11C 29/38* (2013.01); *G11C 29/42* (2013.01); *G11C 29/44* (2013.01); *G11C 29/52* (2013.01); *G11C 2029/0409* (2013.01); *G11C 2029/0411* (2013.01)

(58) Field of Classification Search
CPC .......... G06F 11/0727; G06F 11/0772; G06F 11/0784
USPC ......................................... 714/47.1, 48, 718
See application file for complete search history.

(56) References Cited

U.S. PATENT DOCUMENTS

| | | | | | |
|---|---|---|---|---|---|
| 4,495,603 | A | * | 1/1985 | Varshney | ............ G06F 11/2733 365/189.07 |
| 4,566,093 | A | | 1/1986 | Diaz | |
| 4,654,789 | A | * | 3/1987 | Nusinov | .................. G06F 1/22 703/23 |
| 4,677,548 | A | * | 6/1987 | Bradley | .................... G06F 1/22 711/E12.081 |
| 5,034,686 | A | | 7/1991 | Aspelin | |
| 5,905,690 | A | * | 5/1999 | Sakurai | ............ G01R 31/31701 365/201 |
| 6,256,240 | B1 | * | 7/2001 | Shinozaki | .............. G11C 29/46 365/201 |
| 6,333,879 | B1 | * | 12/2001 | Kato | ...................... G11C 29/02 365/191 |
| 6,353,565 | B2 | * | 3/2002 | Ito | ........................ G11C 7/1078 365/189.05 |

(Continued)

OTHER PUBLICATIONS

Office Action issued by the State Intellectual Property Office of the People's Republic of China on Jan. 12, 2016.

(Continued)

*Primary Examiner* — Joseph D Torres
(74) *Attorney, Agent, or Firm* — IP & T Group LLP

(57) ABSTRACT

A semiconductor memory device includes a plurality of data input/output pads configured to transmit and receive data to and from memory cells, an alert pad configured to output data error information while the data is transmitted and received, and a monitoring device configured to output the data error information to the alert pad in a first mode and to output monitoring information to the alert pad in a second mode.

3 Claims, 5 Drawing Sheets

(56) References Cited

U.S. PATENT DOCUMENTS

| | | | |
|---|---|---|---|
| 6,563,776 B1 | 5/2003 | Oi et al. | |
| 6,996,753 B2* | 2/2006 | Cho | G11C 29/006 |
| | | | 365/201 |
| 7,221,615 B2* | 5/2007 | Wallner | G11C 11/4096 |
| | | | 365/189.05 |
| 7,260,007 B2* | 8/2007 | Jain | G01K 7/425 |
| | | | 365/211 |
| 7,345,930 B2* | 3/2008 | Shin | G11C 7/1006 |
| | | | 365/189.07 |
| 7,450,456 B2* | 11/2008 | Jain | G11C 5/04 |
| | | | 365/189.02 |
| 7,587,625 B2* | 9/2009 | Alexander | G06F 11/106 |
| | | | 714/42 |
| 7,590,473 B2* | 9/2009 | Wyatt | G11C 5/00 |
| | | | 365/212 |
| 8,028,198 B2* | 9/2011 | Resnick | G11C 7/04 |
| | | | 714/42 |
| 2002/0034112 A1* | 3/2002 | Kato | G11C 29/02 |
| | | | 365/201 |
| 2003/0158696 A1* | 8/2003 | Gold | G06F 1/206 |
| | | | 702/132 |
| 2004/0186675 A1 | 9/2004 | Larson et al. | |
| 2006/0239095 A1* | 10/2006 | Shi | G11C 7/04 |
| | | | 365/222 |
| 2007/0121397 A1* | 5/2007 | Lee | G11C 7/1051 |
| | | | 365/201 |
| 2008/0205174 A1* | 8/2008 | Lee | G11C 29/32 |
| | | | 365/201 |
| 2009/0037778 A1* | 2/2009 | Resnick | G11C 7/04 |
| | | | 714/48 |
| 2009/0284239 A1 | 11/2009 | Feng et al. | |
| 2010/0125431 A1* | 5/2010 | Seo | G11C 29/12015 |
| | | | 702/120 |
| 2014/0365814 A1 | 12/2014 | Chillie et al. | |

OTHER PUBLICATIONS

Notice of Allowance issued by the USPTO for another divisional U.S. Appl. No. 14/792,203 of the parent U.S. Appl. No. 13/232,241 on Apr. 18, 2016.

* cited by examiner

MONITORING DEVICE OF INTEGRATED CIRCUIT

CROSS-REFERENCE TO RELATED APPLICATIONS

This application is a division of U.S. patent application Ser. No. 13/232,241 filed on Sep. 14, 2011, which claims priority of Korean Patent Application No. 10-2011-0041554, filed on May 2, 2011. The disclosure of each of the foregoing application is incorporated herein by reference in its entirety.

BACKGROUND

1. Field

Exemplary embodiments of the present invention relate to an integrated circuit, and more particularly, to a monitoring device of an integrated circuit which can monitor in real time whether an internal circuit of an integrated circuit operates normally.

2. Description of the Related Art

It is desirable to develop integrated circuits with high integration, high performance and low power consumption. As integrated circuits become more highly integrated, sizes of devices such as transistors disposed in a chip gradually decrease. Accordingly, methods for ensuring stability and reliability for the characteristics of devices, such as scaled-down transistors, have been developed.

One method for ensuring reliability is to monitor the voltage or temperature of an internal circuit. In general, as a monitoring method, a method has been adopted in which a test pad is additionally provided in an integrated circuit and necessary information is monitored using the test pad. However, this method may have a disadvantage in that a chip size may increase due to the additionally provided test pad.

In order to address this concern, another monitoring method has been suggested, in which desired information is acquired using a data (DQ) pad in a specified mode, for example, a test mode. Nevertheless, this method has a limitation in that it cannot monitor an internal signal in real time while an integrated circuit operates, for example, while an integrated circuit transmits and receives data, but can monitor an internal signal in a specified operation mode. Also, limitations exist in that it is difficult to apply a signal to an internal circuit from outside in the case of a misoperation or to perform an operation margin estimation in order to change an internal operation and characteristic.

SUMMARY

Exemplary embodiments of the present invention are directed to a monitoring device of an integrated circuit which can monitor in real time whether an internal circuit operates normally.

Additionally, exemplary embodiments of the present invention are directed to a monitoring device of an integrated circuit which can forcibly apply a signal internally in the case of a misoperation or for an operation margin evaluation.

In accordance with an exemplary embodiment of the present invention, a semiconductor memory device includes a plurality of data input/output pads configured to transmit and receive data to and from memory cells, an alert pad configured to output data error information while the data is transmitted and received, and a monitoring device configured to output the data error information to the alert pad in a first mode and to output monitoring information to the alert pad in a second mode.

In accordance with another exemplary embodiment of the present invention, a semiconductor memory device includes a plurality of data input/output pads configured to transmit and receive data to and from memory cells, an alert pad configured to output data error information while the data is transmitted and received, and a monitoring device configured to output the data error information to the alert pad in a first mode and to transfer an alert signal inputted from the alert pad to an internal circuit in a second mode.

In accordance with yet another exemplary embodiment of the present invention, a monitoring device of an integrated circuit includes an error detection signal selection unit configured to select one of a first error detection signal including data error information and a second error detection signal including monitoring information, in response to an enable signal and to output an error signal, an output driver configured to drive a pad in response to the error signal, an input driver configured to receive an alert signal inputted through the pad and drive the alert signal as an internal alert signal in a third mode, and a test mode control unit configured to detect the monitoring information and output the second error detection signal when the integrated circuit is not in the third mode, and to output the internal alert signal as the second error detection signal to an internal circuit in the third mode.

In accordance with still another exemplary embodiment of the present invention, a method for monitoring an integrated circuit includes selecting one of a first error detection signal, including data error information, and a second error detection signal, including monitoring information, in response to an enable signal, and outputting an error signal, driving a pad in response to the error signal, receiving an alert signal inputted through the pad and driving the alert signal as an internal alert signal in a third mode, and detecting the monitoring information and outputting the second error detection signal when the integrated circuit is not in the third mode, and outputting the internal alert signal as the second error detection signal to an internal circuit in the third mode.

DETAILED DESCRIPTION

Figure 1:
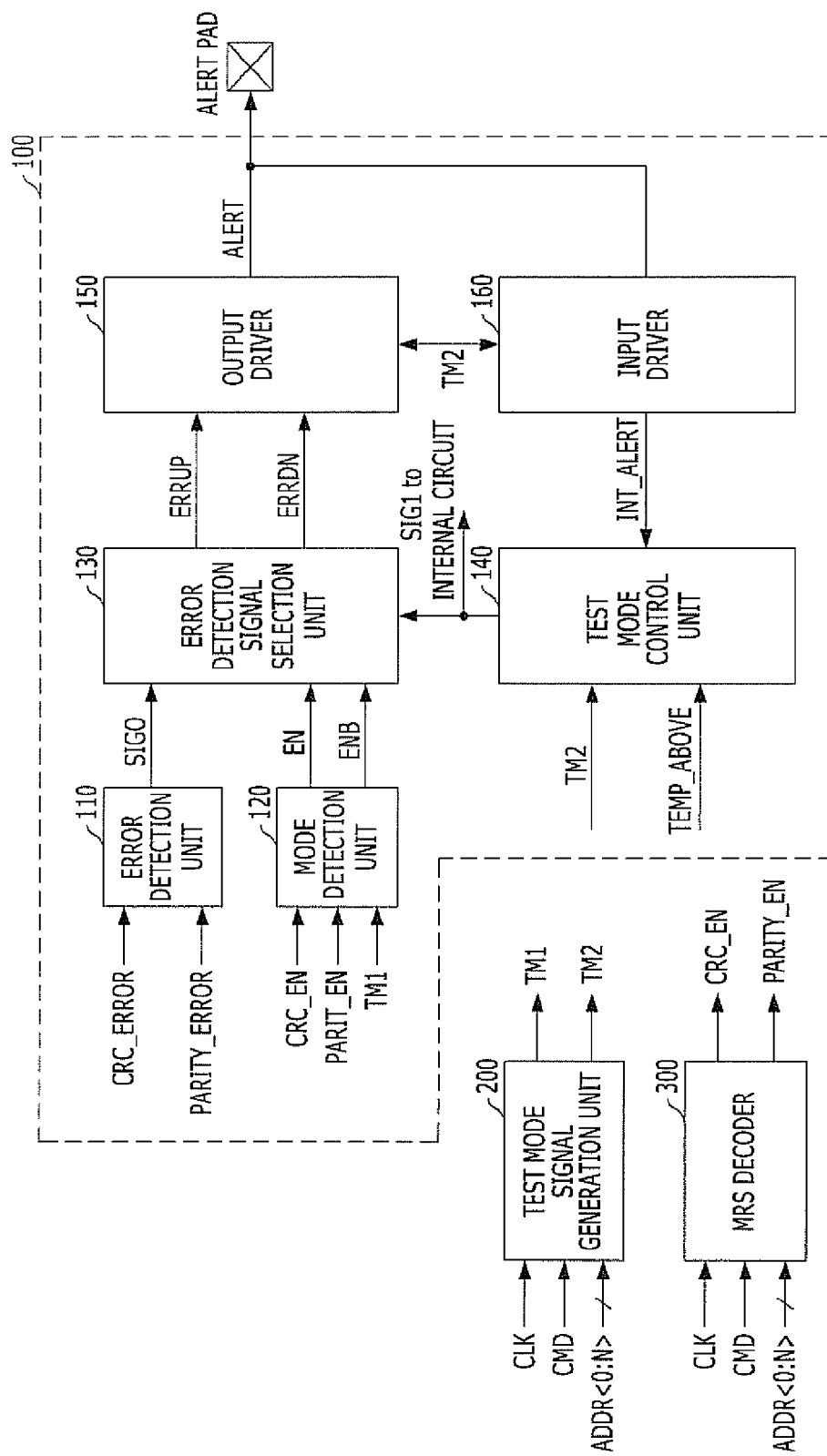
FIG. 1 is a block diagram showing a monitoring device of an integrated circuit in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram showing a monitoring device of an integrated circuit in accordance with an exemplary embodiment of the present invention.

Referring to FIG. 1, an integrated circuit in accordance with an exemplary embodiment of the present invention includes an alert pad ALERT PAD, a monitoring device 100, a test mode signal generation unit 200, and an MRS (mode register set) decoder 300.

The monitoring device 100 is configured to output a cyclic redundancy code (CRC) or parity information to the alert pad ALERT PAD in a CRC or parity mode. Also, the monitoring device 100 in accordance with the exemplary embodiment of the present invention outputs temperature information to the alert pad ALERT PAD in a first test mode, and transfers an alert signal ALERT inputted through the alert pad ALERT PAD to an internal circuit in a second test mode. That is to say, the monitoring device 100 is configured to detect a temperature error and to forcibly input the alert signal ALERT from an outside in addition to detecting a CRC or parity error.

The test mode signal generation unit 200 is configured to decode a clock CLK, a command CMD, and an address ADDR<0:N> which are inputted, and generate a first test mode signal TM1 and a second test mode signal TM2. The first test mode signal TM1 is a signal which is activated to a logic high level in the first test mode in which information, such as environmental information, regarding the operation of the integrated circuit, for example, temperature information, is outputted to the alert pad ALERT PAD. Further, the second test mode signal TM2 is a signal which is activated to a logic high level in the second test mode in which the alert signal ALERT inputted through the alert pad ALERT PAD is transferred to the internal circuit.

The MRS decoder 300 is configured to store information for the CRC mode and the parity mode, and output a CRC enable signal CRC_EN and a parity enable signal PARITY_EN according to the clock CLK, the command CMD and the address ADDRESS<0:N> which are inputted. The CRC enable signal CRC_EN is a signal which is activated to a logic high level in the CRC mode, and the parity enable signal PARITY_EN is a signal which is activated to a logic high level in the parity mode.

In more detail, the monitoring device 100 includes an error detection unit 110, a mode detection unit 120, an error detection signal selection unit 130, a test mode control unit 140, an output driver 150, and an input driver 160.

The error detection unit 110 is configured to receive a CRC error signal CRC_ERROR and a parity error signal PARITY_ERROR, and output a first error detection signal SIG0 with the CRC or parity information. The mode detection unit 120 is configured to receive the CRC enable signal CRC_EN, the parity enable signal PARITY_EN and the first test mode signal TM1, and generate an enable signal EN and its inverted version (hereinafter referred to as the inverted enable signal ENB), which include mode information. The error detection signal selection unit 130 is configured to select one of the first error detection signal SIG0 with the CRC or parity information and a second error detection signal SIG1 with the temperature information according to the enable signal EN and the inverted enable signal ENB, and output a first error signal ERRUP and a second error signal ERRDN. The output driver 150 is configured to drive the alert pad ALERT PAD in response to the first error signal ERRUP and the second error signal ERRDN.

The input driver 160 is configured to receive the alert signal ALERT inputted through the alert pad ALERT PAD from the outside in the second test mode, and drives the alert signal ALERT as an internal alert signal INT_ALERT. The test mode control unit 140 is configured to output the second error detection signal SIG1 to the internal circuit according to the internal alert signal INT_ALERT in the second test mode, and output the second error detection signal SIG1 according to a temperature error signal TEMP_ABOVE when it's not in the second test mode.

Further, in the exemplary embodiment of the present invention, there may be additionally provided a CRC and parity error detection unit (not shown) configured to detect a CRC error in the CRC mode and generate the CRC error signal CRC_ERROR and detect a parity error in the parity mode and generate the parity error signal PARITY_ERROR, and a temperature sensing unit (not shown) configured to activate the temperature error signal TEMP_ABOVE to a logic high level and output the activated temperature error signal TEMP_ABOVE when an operation temperature is higher than a certain temperature (e.g., a predetermined temperature).

Also, in another exemplary embodiment, a voltage detection unit configured to detect a voltage error may be provided. Still in another exemplary embodiment, a signal with sensing delay information may be used in place of the temperature error signal TEMP_ABOVE, and may be replaced with a signal of a semiconductor memory device which requires monitoring.

As described above, the monitoring device 100 outputs the CRC or parity information to the alert pad ALERT PAD in the CRC or parity mode, and outputs the temperature information including information as to whether the operation temperature of the integrated circuit goes beyond a specified range, in the first test mode. That is to say, in this exemplary embodiment of the present invention, target internal information can be monitored during the first test mode by using the alert pad ALERT PAD which has been used only in the CRC or parity mode. Accordingly, during a real time operation, for example, while data is transmitted and received, it is possible to certainly know a critical point where the operation temperature of the integrated circuit goes beyond a specified temperature, by monitoring the alert pad ALERT PAD. For example, in the case of a DRAM device, a refresh control unit may be provided to shorten a refresh cycle when an operation temperature is equal to or higher than 45° C. Even when a misoperation occurs in the refresh control unit and refresh is not performed with a desired cycle, an internal operation may be monitored through the alert pad ALERT PAD.

Also, the monitoring device 100 receives the alert signal ALERT inputted through the alert pad ALERT PAD in the second test mode and transfers the second error detection signal SIG1 to the internal circuit in the integrated circuit. The second error detection signal SIG1 transferred to the internal circuit may include fuse option information to change an internal characteristic using a fuse after monitoring of the first test mode. Otherwise, the second error detection signal SIG1 may be used in a refresh cycle control circuit or to control an internal time or an operation in a semiconductor device in which characteristics change according to temperature. For example, in the case of a DRAM device, if the second error detection signal SIG1 is used as a temperature signal T45_ABOVE which is activated when a temperature is equal to or higher than 45° C., the DRAM device may operate as if its operation temperature is equal to or higher than 45° C. and may be monitored as to whether or not an operation is normally performed.

For reference, the first test mode signal TM1 and the second test mode signal TM2 are not designed to be simultaneously activated. Furthermore, the output driver 150 is designed not to operate in the second test mode, and the input driver 160 is designed to operate only in the second test mode.

Figure 2:
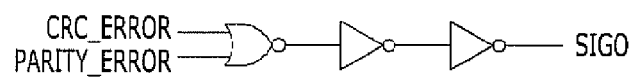
FIG. 2 is a circuit diagram showing an error detection unit of the monitoring device of FIG. 1.

FIG. 2 is a circuit diagram showing the error detection unit 110 of the monitoring device of FIG. 1.

Referring to FIG. 2, the error detection unit 110 includes a NAND gate and two inverters, and performs a NANDing operation for the CRC error signal CRC_ERROR and the parity error signal PARITY_ERROR which are inputted.

Accordingly, the error detection unit 110 receives the CRC error signal CRC_ERROR and the parity error signal PARITY_ERROR and outputs the first error detection signal SIG0 with a logic low level when either the CRC error or the parity error has occurred.

Figure 3:
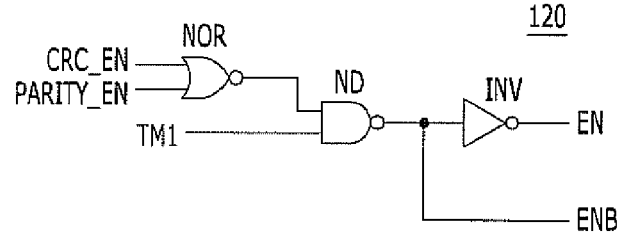
FIG. 3 is a circuit diagram showing a mode detection unit of the monitoring device of FIG. 1.

FIG. 3 is a circuit diagram showing the mode detection unit 120 of the monitoring device of FIG. 1.

Referring to FIG. 3, the mode detection unit 120 may include a NOR gate NOR, a NAND gate ND, and an inverter INV.

The NOR gate NOR receives the CRC enable signal CRC_EN and the parity enable signal PARITY_EN and performs a NOR logic operation. The NAND gate ND receives the output of the NOR gate NOR and the first test mode signal TM1, performs a NAND logic operation, and outputs the inverted enable signal ENB. The inverter INV inverts the output of the NAND gate ND and outputs the enable signal EN.

Accordingly, the mode detection unit 120 outputs the enable signal EN of a logic low level and the inverted enable signal ENB of a logic high level when the CRC enable signal CRC_EN or the parity enable signal PARITY_EN is activated, and outputs the enable signal EN of a logic high level and the inverted enable signal ENB of a logic low level when the first test mode signal TM1 is activated.

Figure 4:
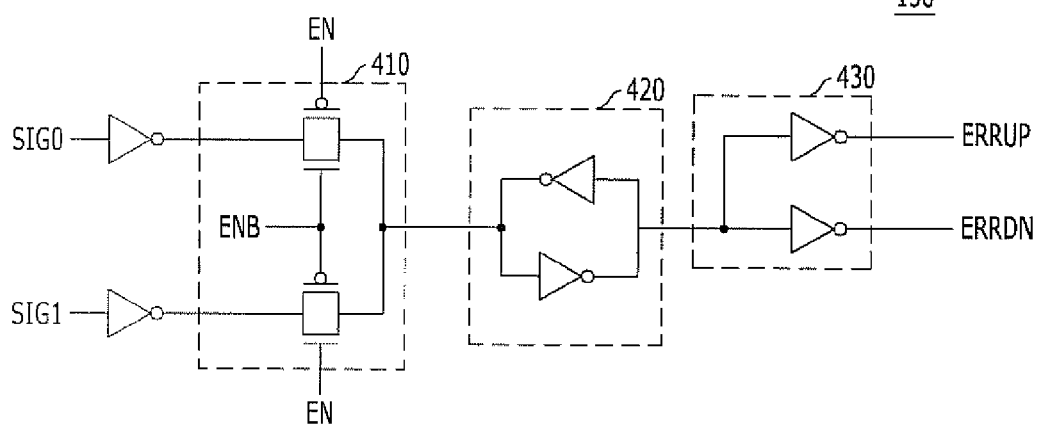
FIG. 4 is a circuit diagram showing an error detection signal selection unit of the monitoring device of FIG. 1.

FIG. 4 is a circuit diagram showing the error detection signal selection unit 130 of the monitoring device of FIG. 1.

Referring to FIG. 4, the error detection signal selection unit 130 includes a transfer section 410, a latch section 420 and an output section 430.

The transfer section 410 is configured to select the first error detection signal SIG0 or the second error detection signal SIG1 in response to the enable signal EN1 and the inverted enable signal EN2. The latch section 420 is configured to latch and output the selected signal of the transfer section 410. The output section 430 inverts the output of the latch section 420 and outputs the first error signal ERRUP and the second error signal ERRDN. In this exemplary embodiment of the present invention, the latch section 420 may be formed by an inverter latch, and in this case, in order to maintain polarities, inverters for respectively inverting the first error detection signal SIG0 and the second error detection signal SIG1 may be provided at the input ends of the transfer section 410.

Accordingly, the error detection signal selection unit 130 selects the first error detection signal SIG0 with the CRC or parity information as the enable signal EN becomes a logic low level in the CRC or parity mode, inverts the first error detection signal SIG0, and outputs the first error signal ERRUP and the second error signal ERRDN. Also, the error detection signal selection unit 130 selects the second error detection signal SIG1 with the temperature information as the enable signal EN becomes a logic high level in the first test mode, inverts the second error detection signal SIG1, and outputs the first error signal ERRUP and the second error signal ERRDN.

Figure 5:
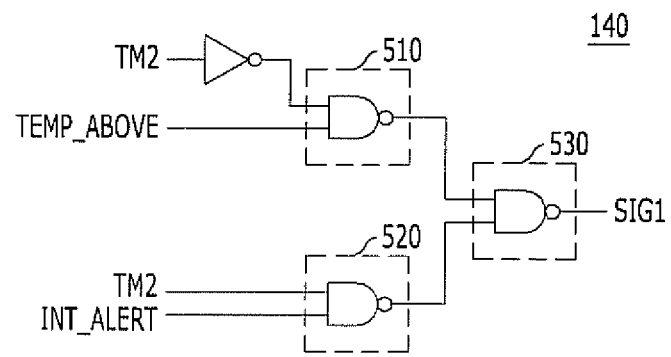
FIG. 5 is a circuit diagram showing a test mode control unit of the monitoring device of FIG. 1.

FIG. 5 is a circuit diagram showing the test mode control unit 140 of the monitoring device of FIG. 1.

Referring to FIG. 5, the test mode control unit 140 includes a first logic control section 510, a second logic control section 520, and a signal combining section 530. The first and second logic control sections 510 and 520 and the signal combining section 530 may be configured with NAND gates, respectively.

The first logic control section 510 is configured to perform a NAND operation on the inverted signal of the second test mode signal TM2 and the temperature error signal TEMP_ABOVE. The second logic control section 520 is configured to perform a NAND operation on the second test mode signal TM2 and the internal alert signal INT_ALERT. The signal combining section 530 is configured to perform a NAND operation on the output of the first logic control section 510 and the output of the second logic control section 520 and to output the second error detection signal SIG1.

Accordingly, the test mode control unit 140 outputs and transfers the internal alert signal INT_ALERT as the second error detection signal SIG1 to the internal circuit in the second test mode, and outputs the temperature error signal TEMP_ABOVE as the second error detection signal SIG1 when it's not in the second test mode.

Figure 6:
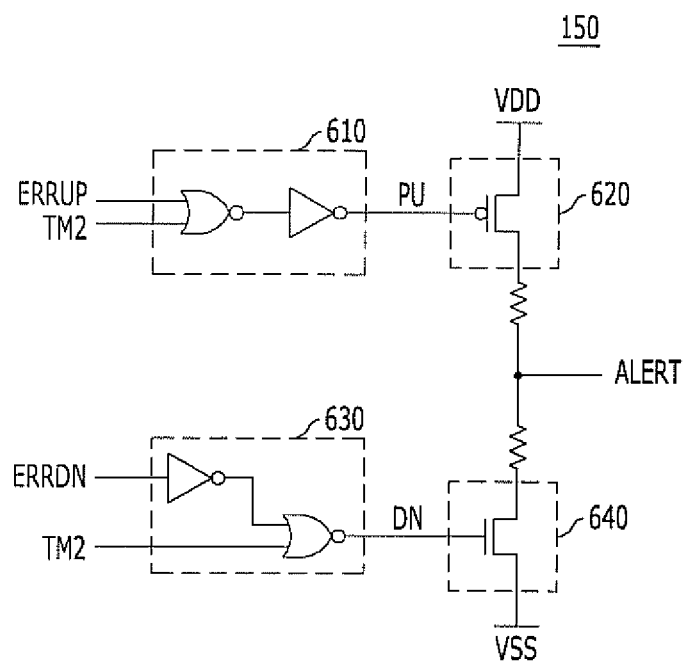
FIG. 6 is a circuit diagram showing an output driver of the in monitoring device of FIG. 1.

FIG. 6 is a circuit diagram showing the output driver 150 of the monitoring device of FIG. 1.

Referring to FIG. 6, the output driver 150 includes a pull-up control section 610, a pull-up transistor 620, a pull-down control section 630, and a pull-down transistor 640.

The pull-up control section 610 is configured to perform an OR operation on the first error signal ERRUP and the second test mode signal TM2, and to generate a pull-up control signal PU. The pull-down control section 630 is configured to perform a NOR operation on the inverted signal of the second error signal ERRDN and the second test mode signal TM2, and to generate a pull-down control signal DN. The pull-up transistor 620 and the pull-down transistor 640 are turned on and off in response to the pull-up control signal UP and the pull-down control signal DN, respectively, and are connected between a power supply voltage VDD and a ground voltage VSS such that their common terminal is connected with the alert pad ALERT PAD.

Accordingly, in the second test mode, the pull-up transistor 620 and the pull-down transistor 640 of the output driver 150 are turned off, thereby floating the common terminal connected to the alert pad ALERT PAD. In this case, the alert pad ALERT PAD is said to be in a high impedance state.

Conversely, when not in the second test mode, the pull-up transistor 620 and the pull-down transistor 640 of the output driver 150 are turned on and off according to the first error signal ERRUP and the second error signal ERRDN. In more detail, when either the CRC error or parity error signal are enabled, both the first error signal ERRUP and the second error signal ERRDN become a logic high level, and therefore, the pull-up transistor 620 is turned off, and the pull-down transistor 640 is turned on. Accordingly, the output driver 150 drives the alert pad ALERT PAD to the level of the ground voltage VSS. However, when the temperature error exists, both the first error signal ERRUP and the second error signal ERRDN become a logic low level, and therefore, the pull-up transistor 620 is turned on, and the pull-down transistor 640 is turned off. Accordingly, the output driver 150 drives the alert pad ALERT PAD to the level of the power supply voltage VDD.

Figure 7:
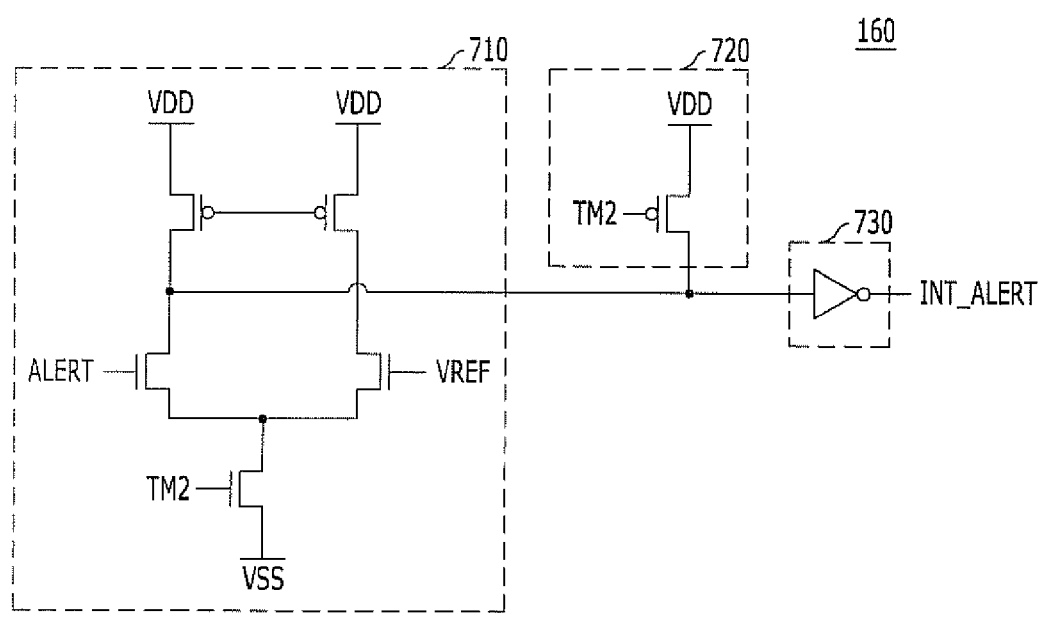
FIG. 7 is a circuit diagram showing an input driver of the monitoring device of FIG. 1.

FIG. 7 is a circuit diagram showing the input driver 160 of the monitoring device of FIG. 1.

Referring to FIG. 7, the input driver 160 includes a comparison section 710, a pull-up driving section 720, and an output section 730.

The comparison section 710 is configured to be enabled in response to the second test mode signal TM2, to compare the alert signal ALERT inputted from the outside with a reference voltage VREF, and to output a comparison result. The pull-up driving section 720 is configured to pull-up drive the output of the comparison section 710 when the second test mode signal TM2 is deactivated. The output section 730 is configured to invert the output of the comparison section 710 and output the internal alert signal INT_ALERT.

Accordingly, the input driver 160 outputs the internal alert signal INT_ALERT with the same polarity as the alert signal ALERT inputted from the outside when the second test mode signal TM2 is activated, and outputs the internal alert signal INT_ALERT to a logic low level regardless of an input signal when the second test mode signal TM2 is deactivated.

Figure 8:
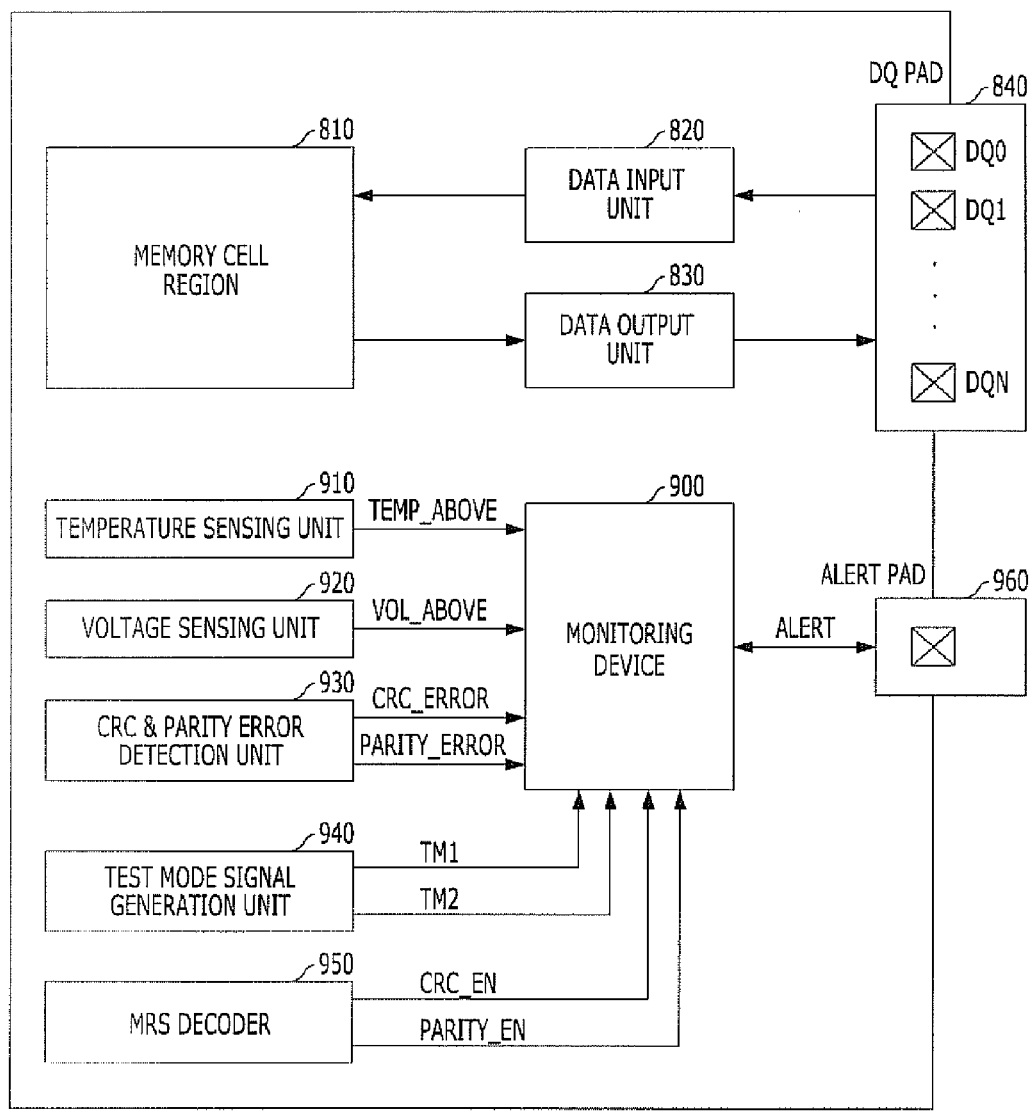
FIG. 8 is a block diagram showing a semiconductor memory device in accordance with another exemplary embodiment of the present invention.

FIG. 8 is a block diagram showing a semiconductor memory device in accordance with another exemplary embodiment of the present invention.

Referring to FIG. 8, a semiconductor memory device in accordance with another exemplary embodiment of the present invention includes a plurality of data input/output (DQ) pads 840 for transmitting and receiving data to and from memory cells in a memory cell region 810, a data input unit 820 for transferring the data inputted through the plurality of DQ pads 840 to the memory cell region 810, and a data output unit 830 for outputting the data of the memory cells in the memory cell region 810 through the plurality of DQ pads 840.

The semiconductor memory device according to the exemplary embodiment of FIG. 8 further includes an alert pad 960 for outputting first error information in a first mode established through an MRS, and a monitoring device 900 for outputting the first error information to the alert pad 960 in the first mode, outputting second error information to the alert pad 960 in a second mode, and transferring an alert signal ALERT inputted through the alert pad 960 to an internal circuit (not shown) in a third mode. Here, the first mode may be a CRC error or parity error detection mode, the second mode may be a monitoring mode for monitoring information (e.g., environmental information) regarding the operation of the semiconductor memory device, for example, a temperature and a voltage, and the third mode may be a test input mode. Also, the first error information may include CRC or parity information, and the second error information may include information for a temperature or a voltage.

In addition, the semiconductor memory device may further include a temperature sensing unit 910 configured to output a temperature signal TEMP_ABOVE when an operation temperature is equal to or higher than a certain temperature (e.g., a predetermined temperature), a voltage sensing unit 920 configured to sense a voltage going beyond a specified range and output a voltage signal VOL_ABOVE, and a CRC and parity error detection unit 930 configured to detect an CRC error and generate a CRC error signal CRC_ERROR and detect a parity error and generate a parity error signal PARITY_ERROR.

Moreover, the semiconductor memory device further includes a test mode signal generation unit 940 configured to decode a clock, a command, and an address, which are inputted to the memory device, and to generate a first test mode signal TM1 and a second test mode signal TM2, and an MRS decoder 950 configured to store information for the CRC error or parity error detection mode and output a CRC enable signal CRC_EN and a parity enable signal PARITY_EN according to the clock, the command, and the address.

Accordingly, the monitoring device 900 according to the exemplary embodiment shown in FIG. 8 outputs the CRC or parity information to the alert pad 960 in the CRC or parity mode, and senses an operation temperature or a voltage of the semiconductor memory device that goes beyond a specified range, in a first test mode and outputs temperature or voltage information to the alert pad 960. That is to say, in the present invention, it is possible to monitor target information through the alert pad 960 in a mode, that is, the first mode, which does not coincide with the CRC or parity mode. Hence, it is possible to monitor in real time whether or not the operation of the semiconductor memory device is normally performed, even while transmitting and receiving data.

Furthermore, the monitoring device 900 receives the alert signal ALERT inputted through the alert pad 960 in a second test mode, and transfers the alert signal ALERT as a second error detection signal SIG1 to the internal circuit in the semiconductor memory device. The second error detection signal SIG1 transferred to the internal circuit may include fuse option information to change an internal characteristic using a fuse after monitoring of the first test mode.

As described above, in the present invention, whether an internal circuit operates normally can be monitored in real time by JO using an alert pad while an integrated circuit transmits and receives data. Also, an alert signal can be forcibly applied to the alert pad from an outside in the case of a misoperation or for an operation margin evaluation to change an internal operation and characteristic.

As is apparent from the above descriptions, in the present invention, whether an internal circuit operates normally can be monitored in real time while an integrated circuit transmits and receives data. Also, a signal can be forcibly applied from an outside in the case of a misoperation or for an operation margin evaluation to change an internal operation and characteristic.

Further, in the monitoring device according to the present invention, since monitoring of target information is made possible in real time without providing an additional test pad for monitoring of an internal circuit, a chip size can be decreased and burdens in terms of area and cost can be lessened.

While the present invention has been described with respect to the specific embodiments, it will be apparent to those skilled in the art that various changes and modifications may be made without departing from the spirit and scope of the invention as defined in the following claims.

What is claimed is:
1. A semiconductor memory device comprising:
   a plurality of data input/output pads configured to transmit and receive data to and from memory cells;
   an alert pad configured to output data error information while the data is transmitted and received; and a monitoring device configured to output the data error information to the alert pad in a first mode, and to transfer an alert signal inputted from the alert pad to an internal circuit in a second mode, wherein the monitoring device transfers the alert signal inputted from the alert pad to an internal circuit in a third mode, and wherein the monitoring device comprises:

an input driver configured to receive the alert signal and drive the alert signal as an internal alert signal in the third mode; and a test mode control unit configured to detect monitoring information and output an error detection signal when the semiconductor memory device is not in the third mode, and to output the internal alert signal as the error detection signal to the internal circuit in the third mode.

2. The semiconductor memory device of claim 1, wherein the first mode is a mode which is established through a MRS, and the second mode is a mode which is established through a test mode.

3. The semiconductor memory device of claim 1, wherein the alert signal inputted from the alert pad in the second mode includes fuse option information.

\* \* \* \* \*